(12) United States Patent
Simula et al.

(10) Patent No.: US 12,052,829 B2
(45) Date of Patent: Jul. 30, 2024

(54) METHOD FOR MANUFACTURING A NUMBER OF ELECTRICAL NODES, ELECTRICAL NODE MODULE, ELECTRICAL NODE, AND MULTILAYER STRUCTURE

(71) Applicant: TactoTek Oy, Oulunsalo (FI)

(72) Inventors: Tomi Simula, Oulunsalo (FI); Tapio Rautio, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 44 days.

(21) Appl. No.: 18/191,427

(22) Filed: Mar. 28, 2023

(65) Prior Publication Data
US 2023/0309242 A1    Sep. 28, 2023

Related U.S. Application Data

(63) Continuation of application No. 17/700,657, filed on Mar. 22, 2022.

(51) Int. Cl.
*H05K 1/02* (2006.01)
*H01L 23/24* (2006.01)
(Continued)

(52) U.S. Cl.
CPC ........... *H05K 3/284* (2013.01); *H05K 1/0393* (2013.01); *H05K 1/111* (2013.01); *H05K 3/0067* (2013.01);
(Continued)

(58) Field of Classification Search
CPC ........ H05K 1/02; H05K 1/274; H05K 1/0393; H05K 1/111; H05K 3/0067; H05K 3/28;
(Continued)

(56) References Cited

U.S. PATENT DOCUMENTS 3,725,501 A    4/1973    Hilbelink et al.
3,851,363 A    12/1974    Booe
(Continued)

FOREIGN PATENT DOCUMENTS

EP    0971401 B1    6/2010

OTHER PUBLICATIONS

Office Action issued in U.S. Appl. No. 17/700,657 dated May 4, 2023 (18 pages).

(Continued)

*Primary Examiner* — Xiaoliang Chen
(74) *Attorney, Agent, or Firm* — Robert P. Michal, Esq.; Carter DeLuca

(57) ABSTRACT

The method for manufacturing a number of electrical nodes, wherein the method includes providing a number of electronic circuits onto a first substrate, such as on a printed circuit board or other electronics substrate, optionally, a low-temperature co-fired ceramic substrate, wherein each one of the electronic circuits includes a circuit pattern and at least one electronics component in connection with the circuit pattern, wherein the electronic circuits are spaced from each other on the first substrate, thereby defining a blank area surrounding each one of the number of electronic circuits, respectively, and providing potting or casting material to embed each one of the number of electronic circuits in the potting or casting material, and, subsequently, hardening, optionally including curing, the potting or casting material to form a filler material layer of the number of electrical nodes.

16 Claims, 6 Drawing Sheets

(51) Int. Cl.
*H01L 23/36* (2006.01)
*H01L 23/492* (2006.01)
*H01L 23/58* (2006.01)
*H05K 1/03* (2006.01)
*H05K 1/11* (2006.01)
*H05K 3/00* (2006.01)
*H05K 3/12* (2006.01)
*H05K 3/28* (2006.01)

(52) U.S. Cl.
CPC ... *H05K 3/1283* (2013.01); *H05K 2203/1316* (2013.01); *H05K 2203/1322* (2013.01)

(58) Field of Classification Search
CPC ...... H05K 3/284; H05K 3/381; H05K 3/1283; H05K 2203/1316; H05K 2203/1322; H01L 21/561; H01L 21/565; H01L 21/4803; H01L 23/24; H01L 23/36; H01L 23/58; H01L 23/145; H01L 23/492; H01L 23/582; H01L 23/5387; H01L 24/24; H01L 24/32; H01L 24/82; H01L 24/97; H01L 25/0655; H01L 25/50; A61B 5/02433; A61B 5/02444; A61B 5/14551; A61B 5/14552; A61B 17/15; A61B 17/142; A61B 17/151; A61B 17/152; A61B 17/155; A61B 17/157; A61B 17/1746; A61B 17/1764
USPC ........... 361/752, 749, 820; 174/260; 257/99, 257/100, 666, 678, 706, 737, 738; 29/832, 841, 740; 606/88, 91, 102
See application file for complete search history.

(56) References Cited

U.S. PATENT DOCUMENTS

| | | | |
|---|---|---|---|
| 4,128,527 A | 12/1978 | Kinjo et al. | |
| 4,160,858 A | 7/1979 | Roedel | |
| 4,237,596 A * | 12/1980 | Hughes | B01D 63/021 96/10 |
| 4,239,877 A | 12/1980 | Roedel | |
| 4,681,904 A | 7/1987 | Yasuda et al. | |
| 4,954,304 A | 9/1990 | Ohtake et al. | |
| 5,173,766 A * | 12/1992 | Long | H01L 23/24 257/668 |
| 5,252,638 A | 10/1993 | Sugimoto et al. | |
| 5,367,441 A * | 11/1994 | Wustlich | G09F 13/0409 362/800 |
| 5,386,342 A * | 1/1995 | Rostoker | H01L 23/564 257/668 |
| 5,475,040 A | 12/1995 | Jamison et al. | |
| 5,492,586 A * | 2/1996 | Gorczyca | H01L 25/0655 29/841 |
| 5,583,378 A * | 12/1996 | Marrs | H01L 21/563 257/730 |
| 5,612,513 A * | 3/1997 | Tuttle | H01L 25/0655 29/841 |
| 5,717,011 A | 2/1998 | Griggs et al. | |
| 5,831,836 A * | 11/1998 | Long | H01L 23/49822 257/667 |
| 5,920,142 A | 7/1999 | Onishi et al. | |
| 5,987,739 A * | 11/1999 | Lake | H01L 21/4803 29/841 |
| 6,021,563 A | 2/2000 | Heo et al. | |
| 6,047,470 A | 4/2000 | Drussel et al. | |
| 6,075,711 A | 6/2000 | Brown et al. | |
| 6,117,705 A | 9/2000 | Glenn et al. | |
| 6,128,201 A | 10/2000 | Brown et al. | |
| 6,165,232 A | 12/2000 | Tieber et al. | |
| 6,219,912 B1 | 4/2001 | Shimizu et al. | |
| 6,280,559 B1 | 8/2001 | Terada et al. | |
| 6,329,228 B1 | 12/2001 | Terashima | |
| 6,365,438 B1 | 4/2002 | Shida et al. | |
| 6,476,507 B1 | 11/2002 | Takehara | |
| 6,543,127 B1 | 4/2003 | Dimaano, Jr. et al. | |
| 6,558,590 B1 | 5/2003 | Stewart | |
| 6,762,074 B1 | 7/2004 | Draney et al. | |
| 6,828,174 B2 * | 12/2004 | Katagiri | H01L 24/06 257/E25.011 |
| 7,081,219 B2 | 7/2006 | Stewart | |
| 8,133,933 B2 | 3/2012 | Rediger et al. | |
| 8,492,790 B2 * | 7/2013 | Lin | H01L 24/97 257/E33.059 |
| 8,873,247 B2 | 10/2014 | Hosokawa | |
| 10,025,969 B2 | 7/2018 | Chang et al. | |
| 11,072,096 B1 | 7/2021 | Trusty | |
| 11,201,095 B1 * | 12/2021 | Boja | H01L 23/24 |
| 11,332,261 B2 * | 5/2022 | Greer | B64F 5/40 |
| 2002/0004250 A1 | 1/2002 | Iketani et al. | |
| 2002/0019072 A1 | 2/2002 | Kobayashi et al. | |
| 2002/0020940 A1 | 2/2002 | Kiritani | |
| 2002/0050631 A1 | 5/2002 | Minamio et al. | |
| 2002/0060361 A1 | 5/2002 | Sasaki | |
| 2002/0168796 A1 | 11/2002 | Shimanuki et al. | |
| 2003/0039455 A1 | 2/2003 | Ouchi | |
| 2003/0057829 A1 * | 3/2003 | Ellens | C09K 11/7739 313/506 |
| 2003/0080341 A1 * | 5/2003 | Sakano | C09K 11/7774 257/E33.059 |
| 2003/0111725 A1 | 6/2003 | Takehara et al. | |
| 2003/0151137 A1 | 8/2003 | Asano et al. | |
| 2003/0176525 A1 | 9/2003 | Hayashi | |
| 2003/0190795 A1 | 10/2003 | Kawakami | |
| 2003/0230794 A1 | 12/2003 | Narita et al. | |
| 2003/0235938 A1 | 12/2003 | Osada | |
| 2004/0038510 A1 | 2/2004 | Munakata et al. | |
| 2004/0049363 A1 | 3/2004 | Shimizu et al. | |
| 2004/0063817 A1 | 4/2004 | Tenda et al. | |
| 2004/0090829 A1 | 5/2004 | Miura et al. | |
| 2004/0164385 A1 * | 8/2004 | Kado | H01L 23/5386 257/E23.079 |
| 2004/0169444 A1 | 9/2004 | Higuchi et al. | |
| 2004/0198043 A1 | 10/2004 | Chen et al. | |
| 2005/0106786 A1 | 5/2005 | Kuratomi et al. | |
| 2005/0133895 A1 | 6/2005 | Ujiie et al. | |
| 2005/0184404 A1 * | 8/2005 | Huang | H01L 31/0203 257/E31.117 |
| 2005/0205845 A1 * | 9/2005 | Delsing | H01L 33/502 428/917 |
| 2005/0236639 A1 * | 10/2005 | Abe | H01L 33/62 257/E33.059 |
| 2005/0258452 A1 | 11/2005 | Konishi et al. | |
| 2006/0022580 A1 * | 2/2006 | Jermann | C09K 11/08 313/503 |
| 2006/0033081 A1 * | 2/2006 | Hintzen | C04B 35/6268 252/301.4 F |
| 2006/0091523 A1 | 5/2006 | Shimanuki | |
| 2006/0202041 A1 | 9/2006 | Hishizawa et al. | |
| 2006/0203872 A1 | 9/2006 | Oka | |
| 2006/0273452 A1 * | 12/2006 | Tsai | H01L 21/561 257/E23.101 |
| 2006/0292753 A1 | 12/2006 | Takahashi et al. | |
| 2007/0052078 A1 | 3/2007 | Kao | |
| 2007/0070229 A1 | 3/2007 | Shizuno | |
| 2007/0166884 A1 | 7/2007 | Li et al. | |
| 2007/0176317 A1 | 8/2007 | Morita et al. | |
| 2007/0241830 A1 | 10/2007 | Harima | |
| 2007/0243667 A1 | 10/2007 | Takano et al. | |
| 2008/0012140 A1 | 1/2008 | Tsukano et al. | |
| 2008/0123178 A1 | 5/2008 | Uchida | |
| 2008/0173995 A1 | 7/2008 | Kuratomi et al. | |
| 2008/0290513 A1 * | 11/2008 | Byun | H01L 21/561 257/738 |
| 2009/0039506 A1 | 2/2009 | Kagaya et al. | |
| 2009/0166896 A1 * | 7/2009 | Yamazaki | H01L 21/76254 438/114 |
| 2009/0289361 A1 | 11/2009 | Fujii | |
| 2009/0309213 A1 | 12/2009 | Takahashi et al. | |
| 2010/0015759 A1 | 1/2010 | Takano et al. | |
| 2010/0079035 A1 | 4/2010 | Matsuzawa et al. | |

(56) References Cited

U.S. PATENT DOCUMENTS

| | | | |
|---|---|---|---|
| 2010/0102438 A1 | 4/2010 | Watanabe et al. | |
| 2010/0133722 A1 | 6/2010 | Watanabe | |
| 2010/0213623 A1 | 8/2010 | Isshiki et al. | |
| 2010/0230789 A1 | 9/2010 | Yorita et al. | |
| 2010/0244234 A1 | 9/2010 | Sonobe et al. | |
| 2010/0252923 A1 | 10/2010 | Watanabe et al. | |
| 2010/0295044 A1 | 11/2010 | Homma et al. | |
| 2010/0330742 A1 | 12/2010 | Sugiyama et al. | |
| 2011/0006418 A1 | 1/2011 | Watanabe et al. | |
| 2011/0037170 A1* | 2/2011 | Shinohara | H01L 21/565 257/737 |
| 2011/0076800 A1 | 3/2011 | Hirai et al. | |
| 2011/0193237 A1 | 8/2011 | Tian et al. | |
| 2012/0146242 A1 | 6/2012 | Fujishima et al. | |
| 2012/0252165 A1 | 10/2012 | Nakanoya et al. | |
| 2013/0070452 A1 | 3/2013 | Urano et al. | |
| 2013/0113091 A1 | 5/2013 | Meng et al. | |
| 2013/0187182 A1 | 7/2013 | Muramatsu et al. | |
| 2013/0187190 A1 | 7/2013 | Muramatsu et al. | |
| 2013/0188361 A1 | 7/2013 | Muramatsu et al. | |
| 2013/0253127 A1 | 9/2013 | Palmese et al. | |
| 2014/0027906 A1 | 1/2014 | Narita et al. | |
| 2014/0104838 A1* | 4/2014 | Reiss | F21K 9/90 362/249.06 |
| 2014/0132368 A1* | 5/2014 | Tsuda | H01L 24/97 333/193 |
| 2014/0145228 A1* | 5/2014 | Bohm | H01L 33/22 257/432 |
| 2014/0183759 A1 | 7/2014 | Konno et al. | |
| 2014/0312476 A1 | 10/2014 | Wang et al. | |
| 2014/0319664 A1 | 10/2014 | Wang et al. | |
| 2014/0377886 A1 | 12/2014 | Koyanagi et al. | |
| 2015/0124455 A1* | 5/2015 | Tamura | H01L 25/0753 362/310 |
| 2015/0130034 A1 | 5/2015 | Chien | |
| 2015/0162270 A1* | 6/2015 | Ashrafzadeh | H01L 23/49562 257/666 |
| 2015/0190079 A1* | 7/2015 | Yamaji | A61B 5/14552 29/841 |
| 2015/0303170 A1 | 10/2015 | Kim et al. | |
| 2015/0332986 A1 | 11/2015 | Tomohiro | |
| 2015/0340311 A1 | 11/2015 | Usami | |
| 2016/0005696 A1 | 1/2016 | Tomohiro | |
| 2016/0133601 A1 | 5/2016 | Ko et al. | |
| 2016/0141272 A1 | 5/2016 | Inakawa | |
| 2017/0079143 A1 | 3/2017 | Ha et al. | |
| 2017/0120563 A1* | 5/2017 | Aldousari | B32B 5/26 |
| 2017/0125293 A1 | 5/2017 | Wang et al. | |
| 2017/0179041 A1* | 6/2017 | Dias | H01L 21/561 |
| 2017/0190082 A1 | 7/2017 | Bartlett et al. | |
| 2017/0243045 A1 | 8/2017 | Chang et al. | |
| 2017/0243046 A1 | 8/2017 | Chang et al. | |
| 2017/0257952 A1 | 9/2017 | Adachi et al. | |
| 2018/0076181 A1* | 3/2018 | Onuma | H01L 25/0753 |
| 2018/0324969 A1 | 11/2018 | Onitsuka et al. | |
| 2019/0058095 A1* | 2/2019 | Choi | H01L 33/56 |
| 2019/0067542 A1* | 2/2019 | Nakabayashi | H01L 33/62 |
| 2019/0189553 A1* | 6/2019 | Hohlfeld | H01L 23/3672 |
| 2019/0259634 A1* | 8/2019 | Wang | H01L 21/561 |
| 2019/0385513 A1 | 12/2019 | Iguchi et al. | |
| 2020/0006315 A1 | 1/2020 | Tsai et al. | |
| 2020/0168577 A1 | 5/2020 | Onitsuka | |
| 2020/0176653 A1* | 6/2020 | Richter | H01L 33/486 |
| 2020/0219734 A1* | 7/2020 | Unezaki | H01L 21/6835 |
| 2020/0219823 A1* | 7/2020 | Unezaki | H01L 21/6836 |
| 2020/0391287 A1 | 12/2020 | Takeuchi et al. | |
| 2021/0050492 A1* | 2/2021 | Choi | H01L 33/60 |
| 2021/0057297 A1* | 2/2021 | Chen | H01L 23/49816 |
| 2021/0098332 A1* | 4/2021 | Wang | H01L 25/50 |
| 2021/0118759 A1* | 4/2021 | Yu | H01L 24/73 |
| 2021/0119087 A1* | 4/2021 | Kim | G02F 1/133605 |
| 2021/0175204 A1 | 6/2021 | Fallourd et al. | |
| 2021/0261720 A1 | 8/2021 | Willems et al. | |
| 2021/0273403 A1* | 9/2021 | Yang | H01S 5/0014 |
| 2021/0296196 A1 | 9/2021 | Ostrowicki et al. | |
| 2021/0308938 A1* | 10/2021 | Kuno | C09D 11/38 |
| 2021/0354398 A1* | 11/2021 | Pokrass | B33Y 80/00 |
| 2021/0399041 A1* | 12/2021 | Park | H01L 33/62 |
| 2022/0085571 A1* | 3/2022 | Chen | H01S 5/02208 |

OTHER PUBLICATIONS

Office Action issued in U.S. Appl. No. 17/700,657 dated Jul. 11, 2022 (22 pages).

Office Action issued in U.S. Appl. No. 17/700,657 dated Sep. 29, 2022 (16 pages).

Office Action issued in U.S. Appl. No. 17/700,657 dated Jan. 6, 2023 (19 pages).

International Search Report issued by the European Patent Office acting as the International Searching Authority in relation to International Application No. PCT/FI2023/050150 dated Jun. 15, 2023 (3 pages).

Written Opinion of the International Searching Authority issued by the European Patent Office acting as the International Searching Authority in relation to International Application No. PCT/FI2023/050150 dated Jun. 15, 2023 (10 pages).

Written Opinion of the International Preliminary Examining Authority dated Mar. 7, 2024, issued in corresponding international application No. PCT/FI2023/050150, 9 pages.

\* cited by examiner

METHOD FOR MANUFACTURING A NUMBER OF ELECTRICAL NODES, ELECTRICAL NODE MODULE, ELECTRICAL NODE, AND MULTILAYER STRUCTURE

CROSS-REFERENCE TO RELATED APPLICATIONS

This application is a continuation of U.S. patent application Ser. No. 17/700,657 filed Mar. 22, 2022, the disclosure of this application is expressly incorporated herein by reference in its entirety.

FIELD OF THE INVENTION

The present invention relates in general to functional, integrated structures, such as electronic (multilayer) assemblies, and methods for manufacturing thereof. In particular, however, not exclusively, the present invention concerns electrical nodes, and methods for manufacturing thereof, for implementing functionality or functionalities in such structures or assemblies including, for example, a molded, optionally injection molded, material layer.

BACKGROUND

There exists a variety of different stacked assemblies and structures in the context of electronics and electronic products. The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

Furthermore, the concept of injection molded structural electronics (IMSE) involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for ex-ample, by suitable plastic material that covers and embeds the underlying elements such as electronics, thus protecting and potentially hiding the elements from the environment.

In typical solutions, electrical circuits have been produced on a printed circuit board (PCB) or a on substrate film, after which they have been overmolded by plastic material. Known structures and methods have, however, some drawbacks, still depending on the associated use scenario. In order to produce an electronic assembly having one or more functionalities, typically rather complex electrical circuits for achieving these functionalities have to be produced on a substrate by printing and/or utilizing SMDs, and then be overmolded by plastic material.

However, in the known solutions, the implementation of complex functionalities may face reliability risks and assembly yield related issues arising from challenges in integrating very dense components and components with complex geometries. Furthermore, the electronic assembly may require, for example, the use of external control electronics which reduces degree of integration and makes the structures less attractive. Directly integrating a possibly large number of dense components and components of complex geometry onto a potentially considerable larger substrate can be challenging and potentially very risky, as reliability will often be affected by molding pressure, for instance, and the assembly yields in different production phases can be very low. Subassemblies mounted or arranged on a PCB and covered with a plastic layer can suffer from mismatch e.g. in terms of thermal expansion, be difficult to be overmolded due to their complex structure, and exhibit stresses in the structure which can tear the subassemblies off their electrical contacts. Challenges in thermal management may also generally cause issues such as overheating.

Accordingly, both direct provision of functional or specifically electrical elements such as related components on a larger host substrate and preparation of collective subassemblies upfront for subsequent mounting thereon have their own downsides in terms of electronics vulnerability, structural and installation complexity as well as thermal management, for example, whereupon there remains room for improvement in terms of related improved or alternative manufacturing techniques and resulting end structures. There is thus still need to develop structures and methods related both to IMSE technology and integrated electronics in general.

Furthermore, in some known attempts, the electronics on the substrate may be protected by a separate cover or shell. Alignment between the cover and the circuit board is very difficult to control. Furthermore, when placing the component or sub-assembly on a substrate, both the misalignment and rotation of the board relative to the cover or shell may cause it more difficult for the pick & place machine vision to correctly identify the actual board orientation and place the contact pads directly on their counterparts on a substrate. Typical issues related to this type of misalignment are misplacement and picking rejects when the machine vision completely fails to recognize the circuit board orientation. Furthermore, the space between the cover and the board has a very complex shape due to component geometry. This makes it challenging to fill the space reliably without leaving voids and those voids will collapse in injection molding, thereby damaging the components. Injection method results in the greatest number of voids and while a pre-fill applying a small amount of filler on the board, allowing it to flow and settle and only then sealing the boards on the shell and then injecting the space full of filler may improve the results, there is still hardly any control of voiding. Vacuum dispensing also helps with voiding but is prohibitively expensive. This increases the amount of process-related costs in the total cost of each of such sub-assemblies.

SUMMARY

The objective of the present invention is to at least alleviate one or more of the above drawbacks associated with the known solutions in the context of integral structures including functional elements such as electronics and utilizing molded or cast material layers or structures.

The objectives of the invention are reached by a method for manufacturing a number of electrical nodes, an electrical node module, an electrical node, and a multilayer structure as defined by the respective independent claims.

According to a first aspect, a method for manufacturing a number of electrical nodes is provided. The method comprises:

obtaining or providing a number of electronic circuits on or onto, respectively, a first substrate, preferably a substantially rigid substrate, such as on a printed circuit board or other electronics substrate, optionally, a low-temperature co-fired ceramic substrate, wherein each one of the electronic circuits comprises a circuit pattern and at least one electronics component in connection with the circuit pattern, wherein the electronic circuits are spaced from each other on the first substrate, thereby defining a blank area surrounding each one of the number of electronic circuits, respectively, providing potting or casting material to embed each one of the number of electronic circuits in the potting or casting material, and, subsequently, hardening, optionally including curing, the potting or casting material to form a filler material layer of the number of electrical nodes.

The obtaining or providing of the number of electronic circuits on or onto, respectively, the first substrate as referred to herein may mean obtaining a ready-made substrate to which at least the circuit pattern(s), and optionally also the electronics component(s), have been provided. The circuit pattern(s) may (have) be(en) done additively, such as by printing or dispensing, or at least partially in a subtractive manner, such as by etching. For example, the provision of circuit pattern(s) may (have) be(en) done by etching, while the electronics component(s) may be added by mounting an electronics component of surface-mount technology (SMT) onto the first substrate to be in connection with the circuit pattern.

The method may, preferably, further comprise providing a barrier or dam element around the number of electronic circuits to confine the potting or casting material, such as flowing thereof, during the provision of the potting or casting material. In some embodiments, the barrier or dam element may be provided prior to the provision of the potting or casting material.

The barrier or dam element may be of initially solid material, such as a (plastic) frame or the like, or it may be provided by initially flowable or dispensable material which is then solidified to form the barrier or dam element.

In other embodiments, the barrier or dam element may be provided after the provision of the potting or casting material, such as pushing a roller or mold or the like, preferably being shaped to correspond at least partly to the shape of the blank area, at least partially towards and into the provided layer of potting or casting material.

In various embodiments, the barrier or dam element defines individual barrier portions around each one of the number of electronic circuits, respectively.

The barrier element may be provided at least partly to a peripheral portion of the first substrate.

The potting or casting material and/or the flowable or dispensable material of the barrier or dam element preferably exhibits quite low viscosity. In various embodiments, the potting or casting material may have a dynamic viscosity less than 5000 centipoises, preferably less than 2500 centipoises, at a temperature of about 20 degrees Celsius.

In some exemplary embodiments, the potting or casting material and/or the flowable or dispensable material of the barrier or dam element may comprise at least one of polyurethane, acrylic, polyester, silicone, polysiloxane, epoxy, and co-polymers thereof. Furthermore, the potting or casting material may comprise a hardener, a cross-linking agent, a polymerization catalyst, or a chain extender.

In some embodiments, the method may comprise applying low pressure, such as substantially a vacuum, at least onto a side of the first substrate comprising the filler material layer for removing bubbles from the filler material layer prior to the hardening.

In some embodiments, the method may, preferably, comprise separating, after the hardening of the filler material layer, the embedded number of electronic circuits from each other along the blank areas so as to provide the number of electrical nodes. The separation may comprise milling, cutting, such as bypass shear cutting, sawing, stamping, waterjet cutting, laser cutting, or abrasive cutting.

Alternatively or in addition, the separating may comprise at least removing portions of the first substrate and the filler material layer at the position of the blank area.

In various embodiments, the separating may only or additionally comprise removing portions of the barrier or dam element and the first substrate below or in contact with the barrier or dam element.

In some embodiments, the separating may comprise removing portions of the first substrate, the barrier or dam element, and the filler material layer at the position of the blank area.

In various embodiments, the separating may comprise alignment of the first substrate based on optical or mechanical alignment markers on the first substrate.

The electrical nodes may be system-in-package (SiP) modules.

In various embodiments, a dimension of the number electrical nodes in a first lateral direction, and optionally in a second perpendicular lateral direction, may be in the range of 5 to 25 millimeters, such as 10, 15, or 20 millimeters.

In various embodiments, a thickness of the number of electrical nodes may be in the range from 1 to 10 or 5 millimeters, preferably in the range from 1.5 to 4 millimeters, and most preferably in the range from 1.8 to 3.5 millimeters.

Furthermore, the at least one electronics component may be a surface-mount or a through-hole device or component.

In various embodiments, the at least one electronics component may be mounted in connection with the circuit pattern with solder paste and/or a number of adhesives.

Furthermore, the method may comprise providing a number of contact pads or patterns at least partly on the opposite side of the first substrate relative and correspondingly to the number of electronic circuits, wherein the contact pads or patterns are connected at least to the corresponding electronic circuits.

In addition, the number of contact pads or patterns may be arranged at least partly adjacent to the blank area, such as less than 2 millimeters from an edge of the blank area.

In various embodiments, the number of electronic circuits on the first substrate may be at least two, such as in the range of 2-50, for example, 2, 4, 9, 16, 25, 30, 36, 40, 45, or 50, or even more.

Just as an example, there may be "5 times 5" or "7 times 8" circuit patterns on the first substrate 11, or "8 times 9", for instance.

Furthermore, the at least one electronics component may be selected from the group consisting of: a microcontroller, an integrated circuit, a transistor, a resistor, a capacitor, an inductor, a diode, a photodiode, a light-emitting diode, a semiconductor switch.

Furthermore, the at least one electronics component, the electronic circuits and/or the remaining multilayer structure may comprise at least one component selected from the group consisting of: electronic component, electromechanical component, electro-optical component, radiation-emitting component, light-emitting component, LED (light-emitting diode), OLED (organic LED), side-shooting LED or other light source, topshooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

According to a second aspect, an electrical node module is provided. The electrical node module comprises a first substrate, preferably a rigid substrate, such as a printed circuit board or other electronics substrate, optionally, a low-temperature co-fired ceramic substrate (LTCC). The electrical node module also comprises a number of electronic circuits on the first substrate, each one of the electronic circuits comprising a circuit pattern and at least one electronics component in connection with the circuit pattern, wherein the number of electronic circuits are spaced from each other on the first substrate, thereby defining a blank area surrounding each one of the number of electronic circuits, respectively. Furthermore, the electrical node module comprises a filler material layer, preferably of potting or casting material, embedding the number of electronic circuits, and extending in a lateral direction being perpendicular relative to a thickness direction of the filler material layer along at least 80 percent of, and/or preferably substantially, the whole length of an electrical node in the lateral direction.

Furthermore, the number of electronic circuits on the first substrate may be at least two, such as in the range of 2-50, for example, 2, 4, 9, 16, 25, 30, 36, 40, 45, or 50, or even more, such as up to 500.

According to a third aspect, an electrical node is provided. The electrical node comprises a first substrate, such as a printed circuit board or other electronics substrate, optionally, a low-temperature co-fired ceramic substrate, and an electronic circuit on the first substrate, the electronic circuit comprising a circuit pattern and at least one electronics component in connection with the circuit pattern. The electrical node also comprises a filler material layer embedding the electronic circuit, embedding the number of electronic circuits, and extending in a lateral direction being perpendicular relative to a thickness direction of the filler material layer, preferably of potting or casting material, along at least 80 percent of, and/or preferably substantially, the whole length of an electrical node in the lateral direction.

According to a fourth aspect, a multilayer structure is provided. The multilayer structure comprises a second substrate, such as a flexible, optionally being thermoformable and/or of plastic, film or sheet, and an electrical node in accordance with the third aspect described hereinabove, the electrical node being arranged onto the second substrate, such as mounted onto a surface thereof. The multilayer structure also comprises a molded material layer, such as injection molded material layer, on the opposite side of the electrical node relative to the second substrate and at least partially, if not completely (except for the portions in contact with other elements, for example, the second substrate) embedding the electrical node in the molded material layer.

The multilayer structure may comprise a second circuit pattern on the second substrate, wherein the electrical node is connected to the second circuit pattern, such as via the number of contact pads or patterns at least partly on the opposite side of the first substrate of the node relative to the electronic circuit thereon.

Furthermore, the second substrate may be a flexible (thermo)plastic film or sheet, preferably having a thickness of 1 millimeter at maximum.

In various embodiments, the second substrate may exhibit a non-planar shape, such as at least locally a 3D shape, for example, being concave or convex.

The present invention provides a method for manufacturing a number of electrical nodes, an electrical node module, an electrical node, and a multilayer structure. The present invention provides advantages over known solutions in that each module can have many, even a very high number of, electrical nodes being manufactured and/or processed simultaneously. Before singulation or separation, electrical nodes move in large panels for which manipulators, such as robots, exist and are affordable. Existing circuit board manipulation, storage and handling equipment are perfectly suitable. Furthermore, control of voiding in the potting or casting material is much easier than in the known attempts. Also, circuit board space may be utilized very efficiently, reducing cost per electrical node.

The manufacturing method and process is moved dramatically towards processes and equipment that are widely available and do not require special expertise to be used. This means that all processing equipment is applicable as-is with no need for specific picking nozzles, grabbers or other expensive equipment. This has the potential to drastically reduce cost and the adoption threshold is very low.

The components can be arranged on the substrate as is most convenient or best for electrical performance, then the filler simplifies the geometry for picking, so there is no need to pay attention to it during design to, for example, always place a flat component in the center or the like.

Various other advantages will become clear to a skilled person based on the following detailed description.

The expression "a number of" may herein refer to any positive integer starting from one (1), that is being one, at least one, or several.

The expression "a plurality of" may refer to any positive integer starting from two (2), that is being two, at least two, or any integer higher than two.

The terms "first", "second" and "third" are herein used to distinguish one element from other element, and not to specially prioritize or order them, if not otherwise explicitly stated.

The exemplary embodiments of the present invention presented herein are not to be interpreted to pose limitations to the applicability of the appended claims. The verb "to comprise" is used herein as an open limitation that does not exclude the existence of also unrecited features. The features recited in the dependent claims are mutually freely combinable unless otherwise explicitly stated.

The novel features which are considered as characteristic of the present invention are set forth in particular in the appended claims. The present invention itself, however, both as to its construction and its method of operation, together with additional objectives and advantages thereof, will be best understood from the following description of specific embodiments when read in connection with the accompanying drawings.

BRIEF DESCRIPTION OF FIGURES

Some embodiments of the invention are illustrated by way of example, and not by way of limitation, in the figures of the accompanying drawings.

DETAILED DESCRIPTION OF SOME EMBODIMENTS

Figure 1A:
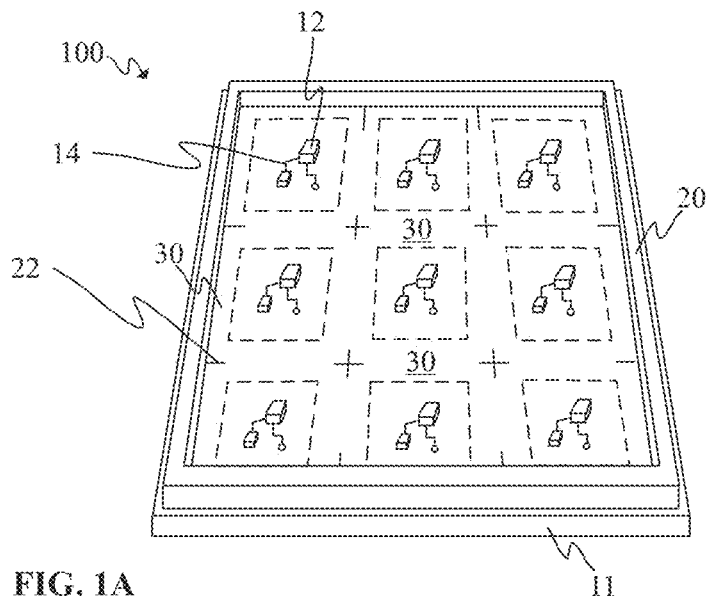
FIGS. 1A-1C illustrate schematically an electrical node module.
Figure 1B:
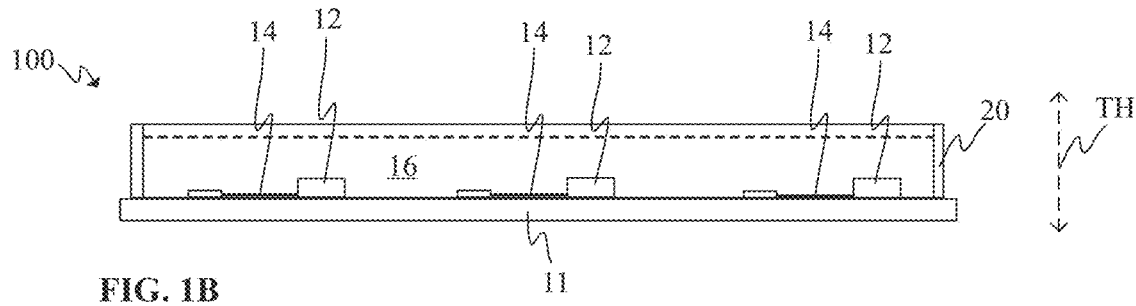
Figure 1C:
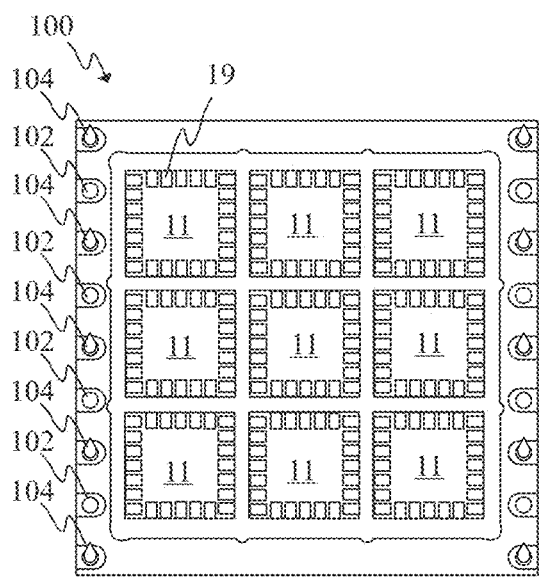

FIGS. 1A-1C illustrate schematically an electrical node module 100. FIG. 1A shows the electrical node module 100 as a perspective view, FIG. 1B as a cross-sectional side view, and FIG. 1C from above/below, that is from a perpendicular direction relative to FIG. 1B.

The electrical node module 100 may comprise a first substrate 11, preferable a rigid substrate, for example, however, not limited to a printed circuit board or other electronics substrate, optionally, a (low-temperature) co-fired ceramic substrate. Furthermore, the electrical node module 100 may comprise a number of electronic circuits on the first substrate 11, each one of the electronic circuits comprising a circuit pattern 14 and at least one electronics component 12 in connection with the circuit pattern 14. The number of electronic circuits may be spaced from each other on the first substrate 11, thereby defining a blank area 30 surrounding each one of the number of electronic circuits, respectively. Furthermore, the electrical node module 100 may comprises a filler material layer 16 embedding the number of electronic circuits, and extending in a lateral direction being perpendicular relative to a thickness direction TH of the filler material layer 16 along at least 80 percent of, and/or preferably substantially, the whole length of an electrical node in the lateral direction.

As visible in FIGS. 1A and 1C, there may be, for example, nine electrical circuits, and thus finally electrical nodes 10, arranged onto the substrate 11. However, in various embodiments, the number of electronic circuits on the first substrate 11 may be at least two, such as in the range of 2-50, for example, 2, 4, 9, 16, 25, 30, 36, 40, 45, or 50, or even more, such as up to 500.

In FIG. 1C, the embedded number of electronic circuits have been separated after the substantially hardening of the filler material layer 16 along the blank areas 30 so as to provide the number of electrical nodes. The separation may have been done by milling, cutting, such as bypass shear cutting, sawing, stamping, waterjet cutting, laser cutting, or abrasive cutting. Alternatively or in addition, the separating may comprises at least removing portions of the first substrate 11 and the filler material layer 16 at the position of the blank area 30.

Furthermore, there may be optical or mechanical alignment markers on the first substrate 11 based on or via which the separation may be done.

In some embodiments, the mechanical alignment markers may be alignment pins 104 that fit into evenly spaced holes 102 on the electrical node module 100 edge (preferably at center points of each "slice" containing one row of electronic circuits, though there may be more than one alignment pin-hole pair per slice and they do not strictly need to be centered, for example, if the center mass of the electrical nodes 10 is not at the center), outside the actual electronic circuit area (where the barrier or dam element 20 confining the potting compound/filler, if any, would also be). The slices may then be further diced to finished electrical nodes 10 using, for example, a grabber that picks up the slice based on the location of alignment pins 104 and stepwise passes it through a sawblade, finally dropping the row of separated electrical node 10 into a container, for instance.

Furthermore, as shown in FIGS. 1A-1C, the electrical node module 100 may comprise a barrier or dam element 20 around the number of electronic circuits. The barrier or dam element 20 may be provided prior to the provision of the potting or casting material or afterwards.

Figure 3A:
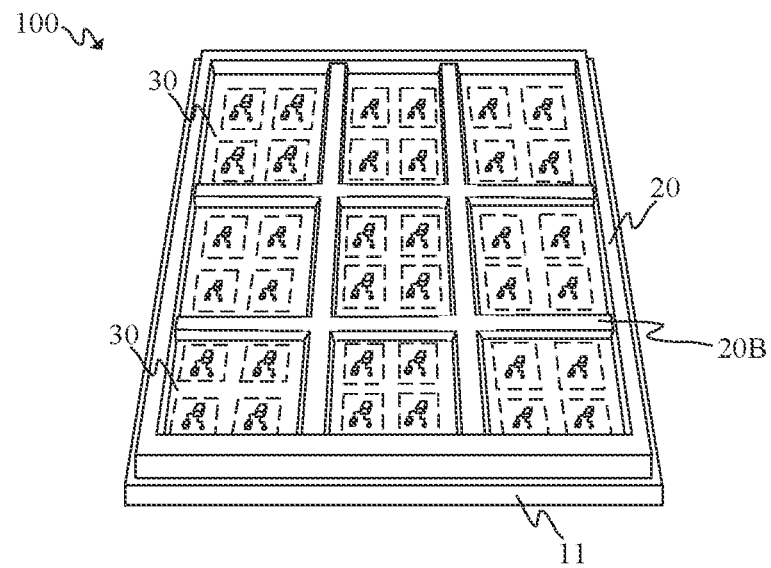
FIGS. 3A and 3B illustrate schematically an electrical node module.
Figure 3B:
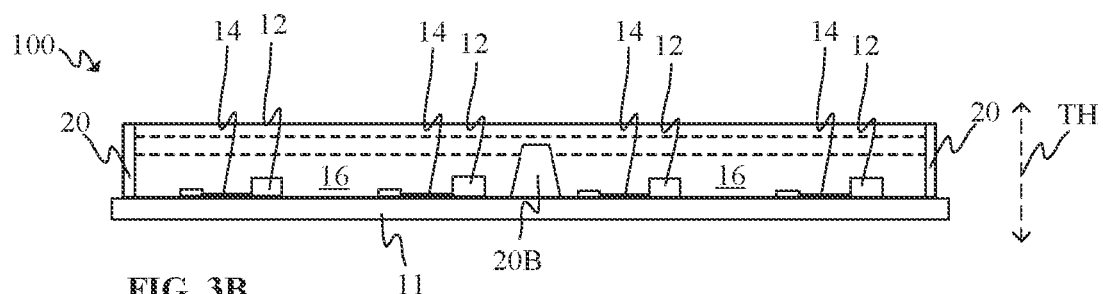

The barrier or dam element 20 may also define individual barrier portions 20B around each one of the number of electronic circuits, respectively, or around sets of the electronic circuits as will be shown in FIGS. 3A and 3B. In various embodiments, the barrier or dam element 20 may be provided at least partly to a peripheral portion of the first substrate 11.

Figure 1D:
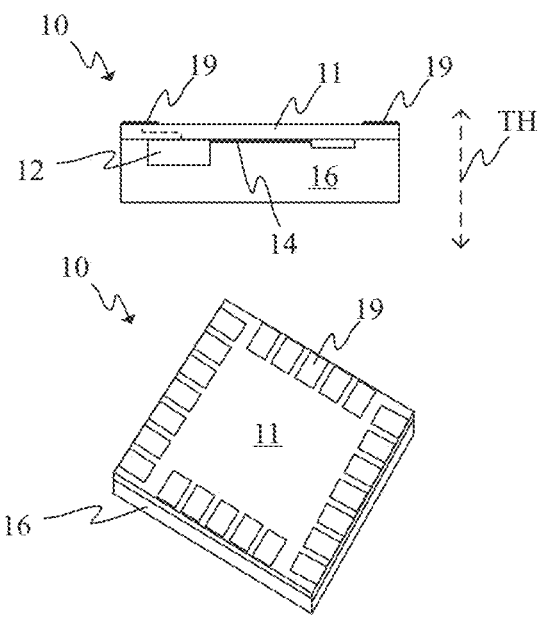
FIG. 1D illustrates schematically an electrical node.

FIG. 1D illustrates schematically an electrical node 10. The electrical node 10 may comprise a first substrate 11, such as a printed circuit board or other electronics substrate, optionally, a low-temperature co-fired ceramic substrate, an electronic circuit on the first substrate 11, the electronic circuit comprising a circuit pattern 14 and at least one electronics component 12 in connection with the circuit pattern 14, and a filler material layer 16 embedding the electronic circuit, embedding the number of electronic circuits, and extending in a lateral direction being perpendicular relative to a thickness direction TH of the filler material layer 16 along at least 80, or 90, percent of, and/or preferably substantially, the whole length of an electrical node in the lateral direction. The electrical node 10 in FIG. 1D may be such that it could have been separated from the electrical node module 100 of FIGS. 1A-1C, however, not necessarily. Furthermore, the electrical node 10 may comprise a number of contact pads or patterns 19 at least partly on the opposite side of the first substrate 11 relative and correspondingly to the number of electronic circuits, wherein the contact pads or patterns 19 are connected at least to the corresponding electronic circuits (such as shown with a dashed line extending through the first substrate 11 in FIG. 1C).

Furthermore, in some embodiments, the number of contact pads or patterns 19 may be arranged at least partly adjacent to the blank area 30, such as less than 2 millimeters from an edge of the blank area 30, such that the separation may be done close to the contact pads or patterns 19. Thus, in some embodiments, the contact pads or patterns 19 may be arranged to a peripheral portion of first substrate 11.

Figure 2A:
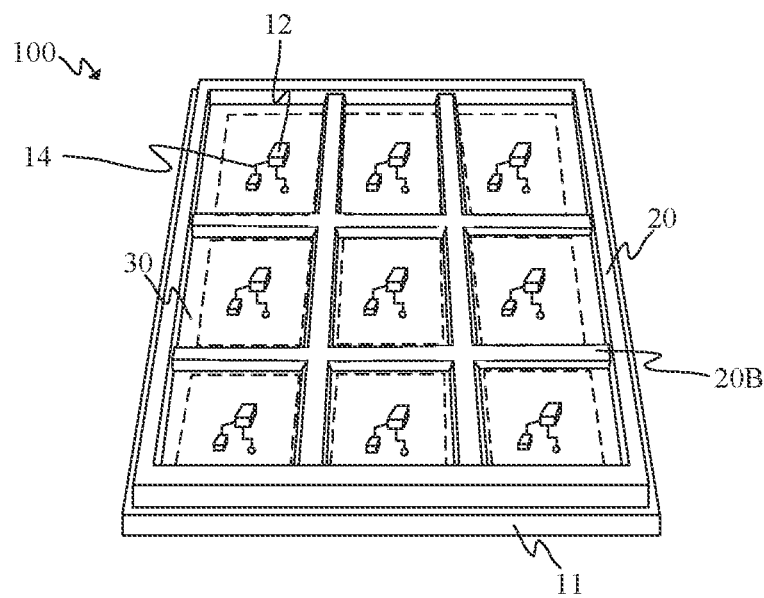
FIGS. 2A and 2B illustrate schematically an electrical node module.
Figure 2B:
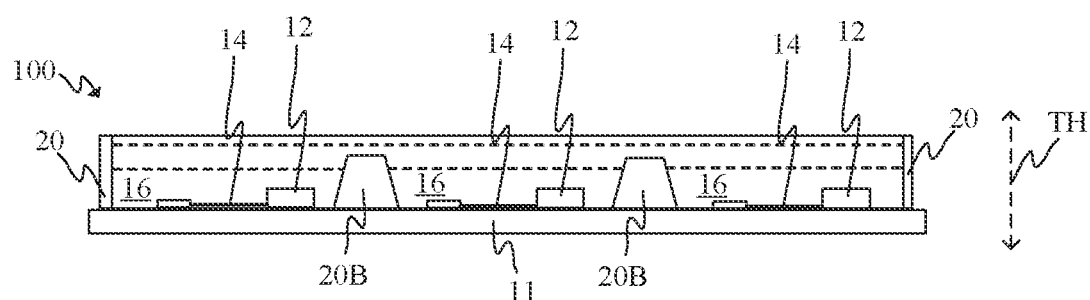

FIGS. 2A and 2B illustrate schematically an electrical node module 100. The electrical node module 100 may be substantially similar to one shown in FIGS. 1A and 1B, however, in FIGS. 2A and 2B, the barrier or dam element 20 also defines individual barrier portions 20B around each one of the number of electronic circuits. The barrier or dam element 20 may be provided at least partly to a peripheral portion of the first substrate 11, but it also comprises individual barrier portions 20B inside the area defined by the barrier or dam element 20 on the peripheral portions of the substrate 11, that is outer portions of the barrier or dam element 20.

As can be seen in FIG. 2B, the surface of the filler material layer 16 may or may not extend higher than the upper end of the individual barrier portions 20B in the direction of the thickness TH of the filler material layer 16. Thus, if the individual barrier portions 20B extend further than said surface, the filler material layer 16 may be discontinuous at the individual barrier portions 20B. If, on the other hand, the surface extends further than the upper end of the individual barrier portions 20B, the filler material layer 16 may be continuous across the module 100.

FIGS. 3A and 3B illustrate schematically an electrical node module 100. The electrical node module 100 may be substantially similar to one shown in FIGS. 2A and 2B, however, in FIGS. 3A and 3B, there are more than one electronic circuits in each one of spaces defined by the barrier or dam element 20. In case of FIGS. 3A and 3B, there are four electronic circuits in each one of the spaces, thus eventually resulting in four electrical nodes 10.

Figure 4:
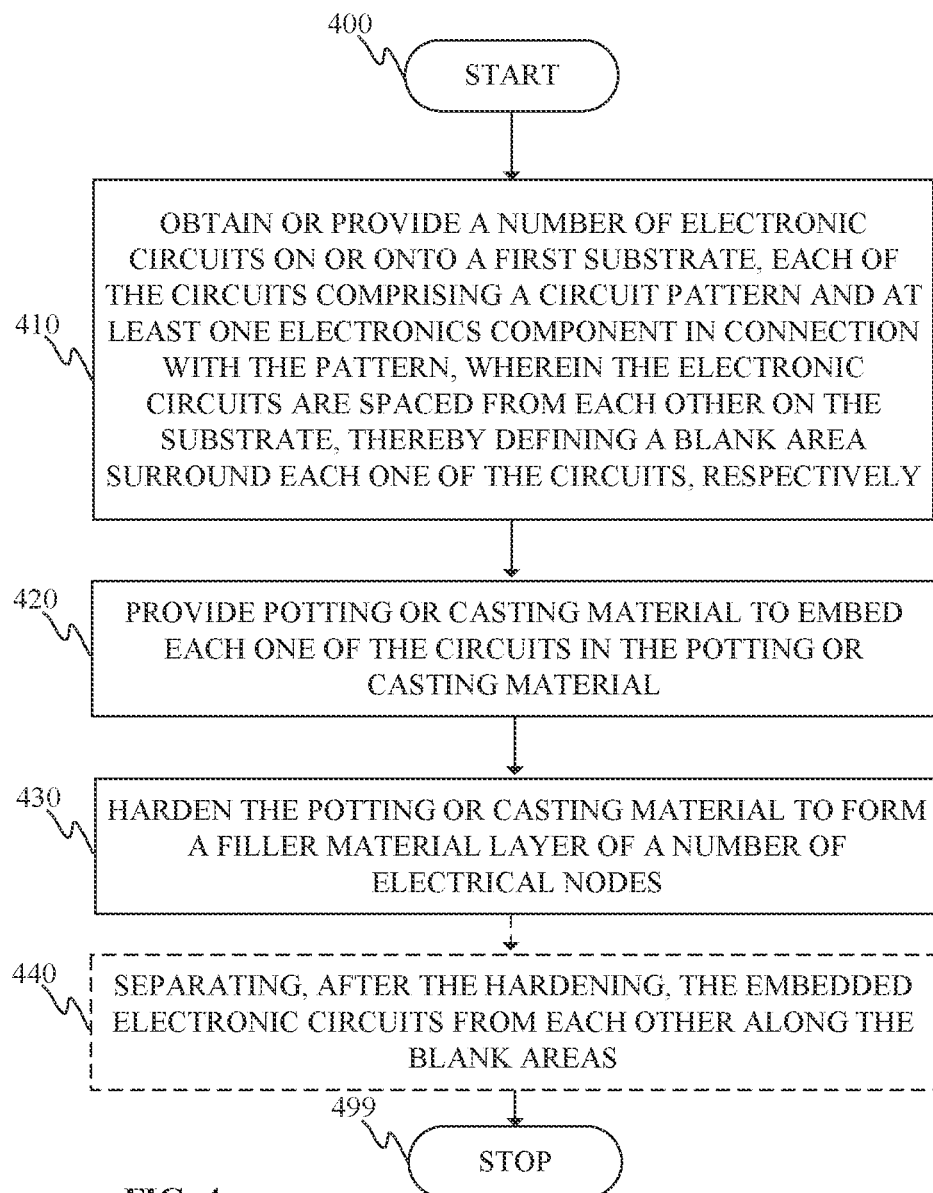
FIG. 4 shows a flow diagram of a method for manufacturing a number of electrical nodes.

FIG. 4 shows a flow diagram of a method for manufacturing a number of electrical nodes 10.

Step or item 400 refers to a start-up phase of the method. Suitable equipment and components are obtained and systems assembled and configured for operation.

Step or item 410 refers to obtaining a number of electronic circuits on or, alternatively, providing a number of electronic circuits onto a first substrate 11, preferably a substantially rigid substrate, such as on a printed circuit board or other electronics substrate, optionally, a low-temperature co-fired ceramic substrate or FR-4 substrate, wherein each one of the electronic circuits comprises a circuit pattern 14 and at least one electronics component 12 in connection with the circuit pattern 14, wherein the electronic circuits are spaced from each other on the first substrate 11, thereby defining a blank area 30 surrounding each one of the number of electronic circuits, respectively.

Step or item 420 refers to providing potting or casting material to embed each one of the number of electronic circuits in the potting or casting material.

Step or item 430 refers to hardening, optionally including curing, the potting or casting material to form a filler material layer of the number of electrical nodes.

In various embodiments, steps 410, 420, and 430 are performed in that order.

Thus, the result is an electrical node module 100 comprising a number of electrical nodes 10 ready to be singulated or separated.

In various embodiments, the method may further comprise, as an optional feature, separating 440, after the hardening of the filler material layer, the embedded number of electronic circuits from each other along the blank areas 30 so as to provide the number of electrical nodes 10. The separation may comprise milling, cutting, such as bypass shear cutting, sawing, stamping, waterjet cutting, laser cutting, or abrasive cutting. Alternatively or in addition, the separating 440 may comprise at least removing portions of the first substrate 11 and the filler material layer 16 at the position of the blank area 30. Still further alternatively or in addition, the separating 440 may comprise alignment of the first substrate 11 based on optical or mechanical alignment markers on the first substrate 11.

In various embodiments, the separating 440 may only or additionally comprise removing portions of the barrier or dam element 20, 20B and the first substrate 11 below or in contact with the barrier or dam element 20, 20B.

In some embodiments, the separating 440 may comprise removing portions of the first substrate 11, the barrier or dam element 20, 20B, and the filler material layer 16 at the position of the blank area 30.

Method execution may be stopped at step or item 499.

In various preferable embodiments, the method may comprise providing a barrier or dam element 20 around the number of electronic circuits to confine the potting or casting material, such as flowing thereof, during the provision 420 of the potting or casting material. The barrier or dam element may be provided prior to the provision 420 of the potting or casting material. The barrier or dam element 20 may be of initially solid material, such as a (plastic) frame or the like, or it may be provided by initially flowable or dispensable material which is then solidified to form the barrier or dam element. The solidification may be done by curing. In some embodiments, the material of the initially flowable or dispensable barrier or dam element 20 may even be the same as that of the potting or casting material, however, not necessarily. Alternatively, the barrier or dam element 20 may be provided after the provision 420 of the potting or casting material. These two alternatives are further explained in connection with FIGS. 6A-6C and 7A-7C.

Preferably, in various embodiments, the barrier or dam element 20 is anyway arranged after the electronic circuits have been arranged onto the first substrate 11, regardless of the potting or casting material being provided before or after the barrier or dam element 20. However, in some embodiments, the barrier or dam element 20 may be arranged before the electronic circuits or at least before the at least one electronics component 12.

In various embodiments, the barrier or dam element 20 may define individual barrier portions 20B around each one of the number of electronic circuits, respectively. Alternatively or in addition, the barrier or dam element 20 may be provided at least partly to a peripheral portion of the first substrate 11.

Regarding the properties of the potting or casting material, the potting or casting material may have a dynamic viscosity less than 5000 centipoises, preferably less than 2500 centipoises, at a temperature of about 20 degrees Celsius.

Alternatively or in addition, the potting or casting material may comprise at least one of polyurethane, acrylic, polyester, silicone, polysiloxane, epoxy, and co-polymers thereof.

In some embodiments, the potting or casting material may further comprise a hardener, a cross-linking agent, a polymerization catalyst, or a chain extender.

Regarding the materials, in some embodiments, two-component oligomeric/polymeric resin and a reactive hardener material may be used. In other embodiments, polymerization of smaller monomers to form the polyester mentioned before may be used.

In various embodiments, two-component potting or casting materials may be mixed and then the curing/cross-linking/polymerization may be arranged to happen at room temperature over time. However, it can alternatively be accelerated with added heat if that is considered necessary.

In an embodiment, the method may comprise applying low pressure, such as substantially a vacuum, at least onto a side of the first substrate 11 comprising the filler material layer 16 for removing bubbles from the filler material layer 16 prior to the hardening.

In some embodiments, the method may comprise applying hot gas to the filler material layer 16 for destroying bubbles within the filler material layer 16 prior to the hardening 430.

In various embodiments, the electrical nodes may be system-in-package (SiP) modules.

Furthermore, a dimension of the number electrical nodes 11 in a first lateral direction, and optionally in a second perpendicular lateral direction, is in the range of 5 to 25 millimeters, such as 10, 15, or 20 millimeters. The lateral directions are perpendicular relative to the thickness direction TH of the filler material layer 16.

Alternatively or in addition, a thickness of the number of electrical nodes 11 in the direction of the thickness TH is in the range from 1 to 10 or 5 millimeters, preferably in the range from 1.5 to 4 millimeters, and most preferably in the range from 1.8 to 3.5 millimeters.

Alternatively or in addition, the at least one electronics component 12 may be a surface-mount or a through-hole device or component.

In various embodiments, the at least one electronics component 12 may be mounted in connection with the circuit pattern 14 with solder paste and/or a number of adhesives. For example, solder paste and reflow soldering may be used.

In various embodiments, the method may comprise providing a number of contact pads or patterns 19 at least partly on the opposite side of the first substrate 11 relative and correspondingly to the number of electronic circuits, wherein the contact pads or patterns 19 are connected at least to the corresponding electronic circuits.

Furthermore, the number of contact pads or patterns 19 may be arranged at least partly adjacent to the blank area 30, such as less than 1 or 2 millimeters from an edge of the blank area 30. Thus, during the singulation or separation 440, the contact pads or patterns 19 may be left close to the edge of the electrical node 10, that is on the peripheral portion thereof.

The number of electronic circuits on the first substrate 11 may at least two, such as in the range of 2-50, for example, 2, 4, 9, 16, 25, 30, 36, 40, 45, or 50, or even more, such as up to 500.

The at least one electronics component 12 may selected, for example, from the group consisting of: a microcontroller, an integrated circuit, a transistor, a resistor, a capacitor, an inductor, a diode, a photodiode, a light-emitting diode, a semiconductor switch. Other known electronics components may also be utilized.

Furthermore, the electronic circuits and/or the remaining multilayer structure may comprise at least one component selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

Figure 5:
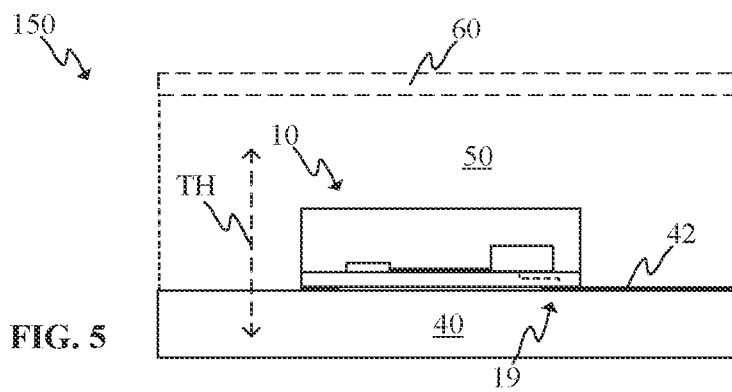
FIG. 5 illustrates schematically a multilayer structure.

FIG. 5 illustrates schematically a multilayer structure 150. The multilayer structure 150 may comprise a second substrate 40, such as a flexible film or sheet. The second substrate 40 may be (thermo)formable. Furthermore, the second substrate 40 may comprise substantially electrically insulating material at least on the surface thereof. Thus, circuit patterns may be provided thereto, such as by printing. The multilayer structure 150 may also comprise an electrical node 10 arranged onto the second substrate 40. The electrical node 10 may be such as described hereinbefore. Still further, the multilayer structure 150 may comprise a molded material layer 50, such as injection molded material layer, on the opposite side of the electrical node 10 relative to the second substrate 40 and at least partially embedding the electrical node 10 in the molded material layer 50.

The multilayer structure 150 may comprise a second circuit pattern 42 on the second substrate 40, wherein the electrical node 10 is connected to the second circuit pattern 42.

Alternatively or in addition, the second substrate 40 may be a flexible plastic film or sheet, preferably having a thickness of 1 millimeter at maximum.

Furthermore, the second substrate 40 may exhibit a non-planar shape, such as at least locally a 3D shape, for example, being concave or convex.

In various embodiments, the second substrate 40 may have been formed, such as thermoformed, to exhibit a non-planar shape, at least locally. The forming may have been performed prior to arranging the electrical node 10 onto the second substrate 40 or alternatively after the arranging the electrical node 10 onto the second substrate 40. Vacuum forming, thermoforming, cold forming, negative pressure forming, high pressure forming, or the like may be utilized in the forming.

As shown in FIG. 5, the multilayer structure 150 may further comprise a third substrate 60. The third substrate 60, such as a flexible film or sheet, such as of thermoplastic material and being thermoformable, may be arranged on the opposite side of the molded material layer 50 relative to the electrical node 10 and/or the second substrate 40. The third substrate 60 may also be thermoformed prior to or simultaneously when providing the molded material layer 50 between the second 40 and third substrates 60.

The structure 150 may be and in many use scenarios will be connected to an external system or device such as a host device or host arrangement of the structure, which may be implemented by a connector, e.g. electrical connector, or connector cable that may be attached to the structure 150 and its elements such as the electrical node 10 in a selected fashion, e.g. communications and/or power supply wise. The attachment point may be on a side or bottom of the structure (e.g. via a through-hole in the second substrate 40), for example.

In various embodiments, electrically conductive elements of the electronic circuits and/or the multilayer structure 150, such as conductive traces, conductors, pads, etc., may include at least one material selected from the group consisting of: conductive ink, conductive nanoparticle ink, copper, steel, iron, tin, aluminium, silver, gold, platinum, conductive adhesive, car-bon fibre, alloy, silver alloy, zinc, brass, titanium, solder, and any component thereof. The used conductive materials may be optically opaque, translucent and/or transparent at desired wavelengths, such as at least portion of visible light, so as to mask or let the radiation such as visible light to be reflected therefrom, absorbed therein or let through, for instance.

Typically, ready-made components including electronic components such as various SMDs may be attached to the contact areas on the substrate(s) e.g. by solder and/or adhesives. For example, light source(s) (e.g. LEDs) of selected technology and packaging may be provided here as well as e.g. different elements of control electronics, communication, sensing, connecting (e.g. connectors), hosting (circuit board(s), carrier(s), etc.) and/or power provision (e.g. battery) depending on the embodiment. A suitable pick-and-place or other mounting device may be utilized for the purpose, for instance. Alternatively or additionally, printed electronics technology may be applied to actually manufacture at least part of the components, such as OLEDs, directly onto the substrates(s), or specifically the film(s) or sheet(s).

In various embodiments, possible additional layers or generally features, may be added into the multilayer structure 150 by molding, lamination or suitable coating (e.g. deposition) procedure not forgetting other possible positioning or fixing techniques. The layers may be of protective, indicative and/or aesthetic value (graphics, colors, figures, text, numeric data, etc.) and contain e.g. textile, leather or rubber materials instead of or in addition to further plastics. Additional elements such as electronics, modules, module internals or parts, and/or optics may be installed and fixed e.g. at the outer surface(s) of the structure, such as the exterior surface of an included film or a molded layer depending on the embodiment. Necessary material shaping/cutting may take place. For example, a diffuser may be produced from locally lasering lightguide material. If provided with a connector, the connector of the multilayer structure may be connected to a desired external connecting element such as an external connector of an external device, system or structure, e.g. a host device. For example, these two connectors may together form a plug-and-socket type connection and interface. The multilayer structure may also be generally positioned and attached herein to a larger ensemble such as an electronic device such as a personal communications device, computer, household apparatus, industrial device, or e.g. a vehicle in embodiments wherein the multilayer structure establishes a part of vehicle exterior or interior, such as a dashboard.

Figure 6A:
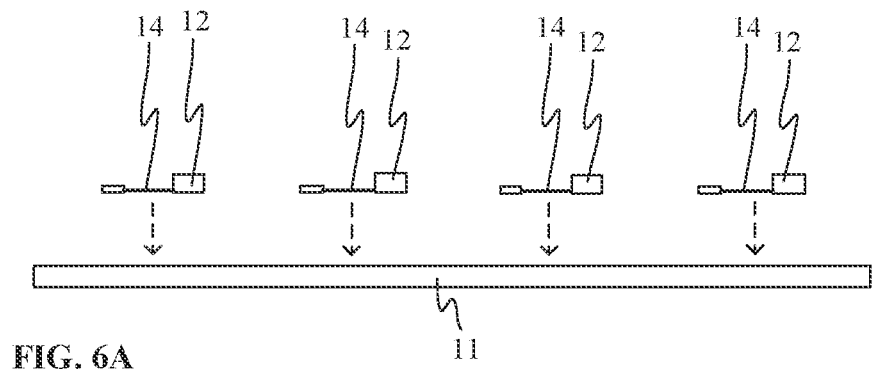
FIGS. 6A-6C illustrate some stages of a manufacturing process of a number of electrical nodes or of an electrical node module.
Figure 6B:
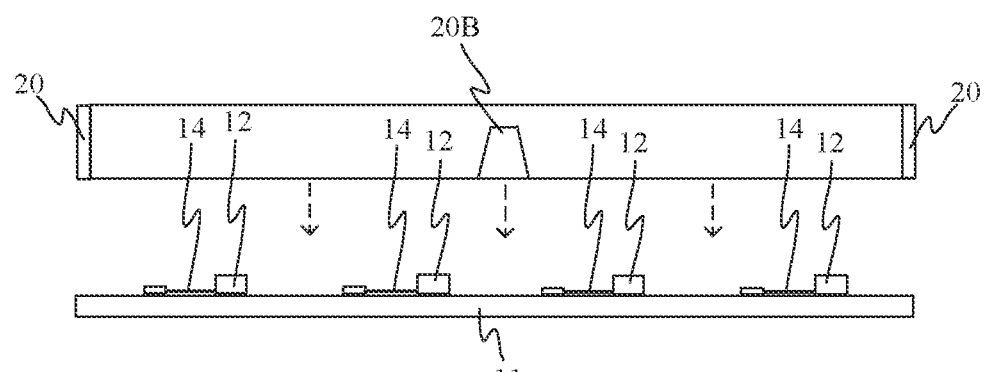
Figure 6C:
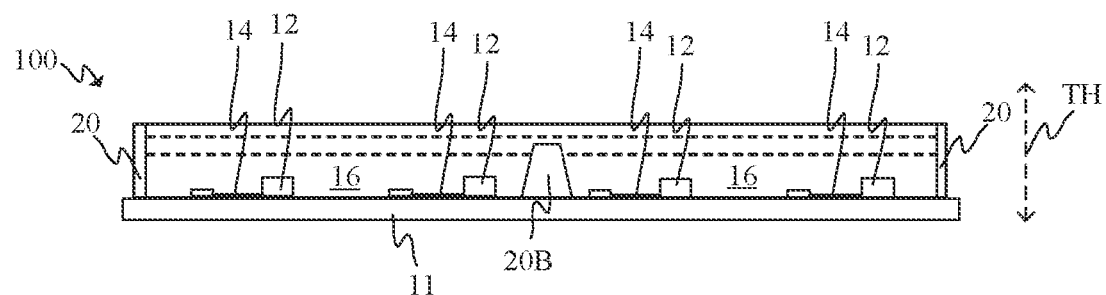

FIGS. 6A-6C illustrate some stages of a manufacturing process of a number of electrical nodes or of an electrical node module 100. FIG. 6A shows the provision of a number of electronic circuits onto a first substrate 11, preferably a substantially rigid substrate, such as on a printed circuit board or other electronics substrate, optionally, a low-temperature co-fired ceramic substrate or FR-4 substrate, wherein each one of the electronic circuits comprises a circuit pattern 14 and at least one electronics component 12 in connection with the circuit pattern 14, wherein the electronic circuits are spaced from each other on the first substrate 11, thereby defining a blank area 30 surrounding each one of the number of electronic circuits, respectively. In some embodiments, the first substrate 11 may be obtained as a ready-made assembly comprising the number of electronic circuits thereon and the blank area 30 as described.

FIG. 6B shows providing a barrier or dam element 20 around the number of electronic circuits to confine the potting or casting material, such as flowing thereof, during the provision of the potting or casting material. The barrier or dam element is provided prior to the provision of the potting or casting material.

FIG. 6C shows providing potting or casting material to embed each one of the number of electronic circuits in the potting or casting material. After that, the potting or casting material may still be hardened, optionally including curing, to form a filler material layer 16 of the number of electrical nodes 11. Finally, there may be a step of separating the electrical nodes 10 still performed.

Figure 7A:
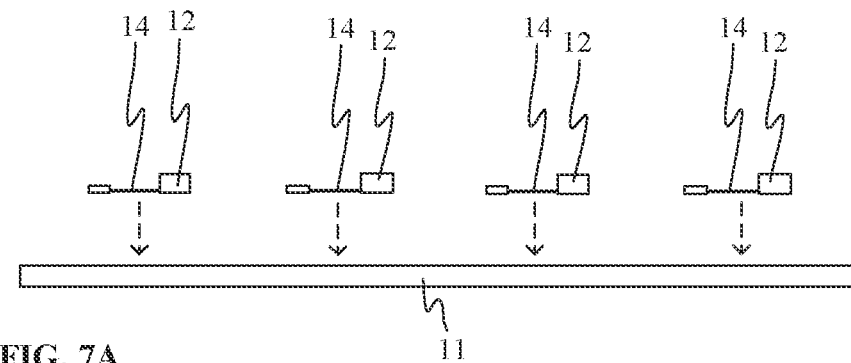
FIGS. 7A-7C illustrate some stages of manufacturing process of a number of electrical nodes or of an electrical node module.
Figure 7B:
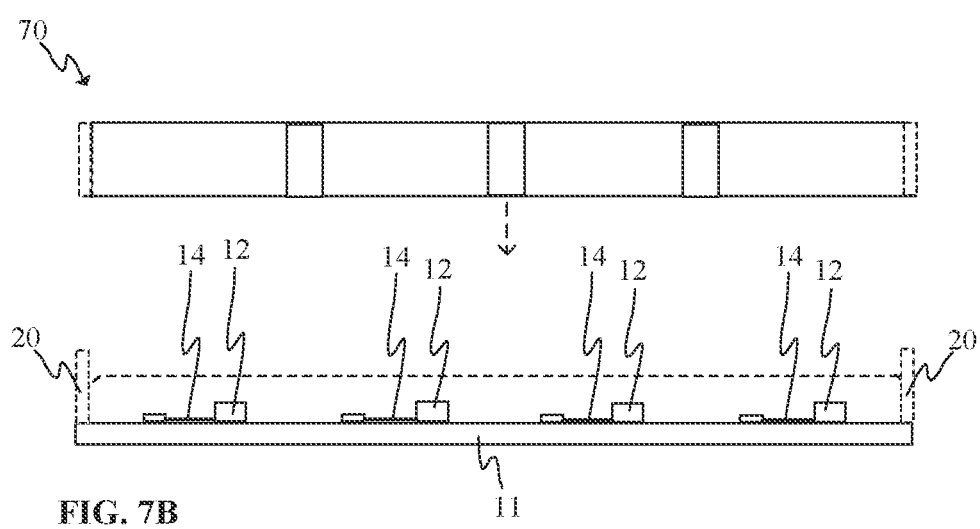
Figure 7C:
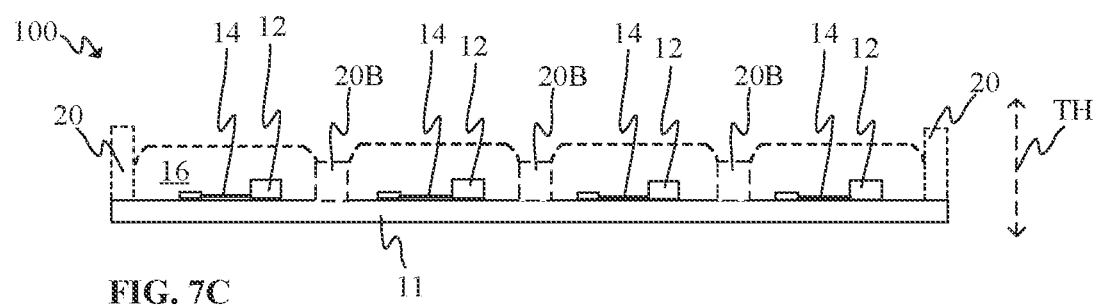

FIGS. 7A-7C illustrate some stages of manufacturing process of a number of electrical nodes or of an electrical node module 100. FIG. 7A shows the provision of a number of electronic circuits onto a first substrate 11, preferably a substantially rigid substrate, such as on a printed circuit board or other electronics substrate, optionally, a low-temperature co-fired ceramic substrate or FR-4 substrate, wherein each one of the electronic circuits comprises a circuit pattern 14 and at least one electronics component 12 in connection with the circuit pattern 14, wherein the electronic circuits are spaced from each other on the first substrate 11, thereby defining a blank area 30 surrounding each one of the number of electronic circuits, respectively. In some embodiments, the first substrate 11 may be obtained as a ready-made assembly comprising the number of electronic circuits thereon and the blank area 30 as described.

FIG. 7B shows providing potting or casting material to embed each one of the number of electronic circuits in the potting or casting material.

FIG. 7C shows providing a barrier or dam element 20 around the number of electronic circuits. The barrier or dam element 20 may be provided after to the provision of the potting or casting material to form a filler material layer 16 of the number of electrical nodes 11.

In various embodiments, the barrier or dam element 20 may be provided after the provision of the potting or casting material layer by pushing a roller or mold 70 at least partly into the unhardened potting or casting material so that surface of the potting or casting material lowers in such portions. Thus, the barrier or dam element 20 may thus be formed at the thinner portions where the step of separation is to be performed. However, this does not have to be done in all blank areas but only some of them. In various embodiments, the roller or mold 70 may preferably have been shaped so as to correspond to the shape at least portion of the blank areas 30 on the first substrate 11.

In some embodiments, the roller or mold 70 or some other element which can be used to press or push into the potting or casting material may be heated prior to being pushed into the potting or casting material. The heating provides curing effect at least to portions coming in contact with the potting or casting material. Thus, the electrical nodes 10 may be more quickly separated from each other since the potting or casting material is substantially hardened at those portions where the separation occurs, even if other portions are still at least not completely, if at all, hardened.

The scope of the present invention is determined by the attached claims together with the equivalents thereof. A person skilled in the art will appreciate the fact that the disclosed embodiments were constructed for illustrative purposes only, and other arrangements applying many of the above principles could be readily prepared to best suit each potential use scenario.

The invention claimed is:

1. An electrical node module, comprising:
   a first substrate;
   a number of electronic circuits on the first substrate, each one of the electronic circuits comprising a circuit pattern and at least one electronics component in connection with the circuit pattern, wherein the number of electronic circuits are spaced from each other on the first substrate, thereby defining a blank area surrounding each one of the number of electronic circuits, respectively;
   a plurality of alignment pins that fit into evenly spaced holes on the first substrate; and
   a filler material layer embedding the number of electronic circuits, and extending in a lateral direction being perpendicular relative to a thickness direction (TH) of the filler material layer along at least 80 percent of the whole length of an electrical node in the lateral direction, wherein the filler material includes a potting or casting material that comprises at least one of polyurethane, acrylic, polyester, silicone, polysiloxane and co-polymers thereof.

2. The electrical node module of claim 1, wherein a barrier or dam element is disposed around the number of electronic circuits to confine the potting or casting material.

3. The electrical node module of claim 2, wherein the barrier or dam element defines individual barrier portions around each one of the number of electronic circuits, respectively.

4. The electrical node module of claim 2, wherein the barrier or dam element is provided at least partly to a peripheral portion of the first substrate.

5. The electrical node module of claim 2, wherein the potting or casting material has a dynamic viscosity less than 5000 centipoises at a temperature of about 20 degrees Celsius.

6. The electrical node module of claim 2, wherein the potting or casting material further comprises epoxy.

7. The electrical node module of claim 6, wherein the potting or casting material comprises a hardener, a crosslinking agent, a polymerization catalyst, or a chain extender.

8. The electrical node module of claim 1, further comprising optical or mechanical alignment markers on the first substrate.

9. The electrical node module of claim 1, wherein the electrical node is a system-in-package (SiP) module.

10. The electrical node module of claim 1, wherein a dimension of the electrical node in a first lateral direction is in the range of 5 to 25 millimeters.

11. The electrical node module of claim 1, wherein a thickness of the electrical node in a thickness direction (TH) is in the range from 1 to 10 millimeters.

12. The electrical node module of claim 1, wherein the at least one electronics component is a surface-mount or a through-hole device or component.

13. The electrical node module of claim 1, wherein the at least one electronics component is mounted in connection with the circuit pattern with solder paste and/or a number of adhesives.

14. The electrical node module of claim 1, wherein a number of contact pads or patterns are disposed at least partly on an opposite side of the first substrate relative and correspondingly to the number of electronic circuits, wherein the contact pads or patterns are connected at least to the corresponding electronic circuits.

15. The electrical node module of claim 13, wherein the number of contact pads or patterns are arranged at least partly adjacent to the blank area.

16. The electrical node module of claim 1, wherein the at least one electronics component is selected from the group consisting of: a microcontroller, an integrated circuit, a transistor, a resistor, a capacitor, an inductor, a diode, a photodiode, a light-emitting diode, a semiconductor switch, electronic component, electromechanical component, electro-optical component, radiation-emitting component, light-emitting component, OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, microprocessor, microcontroller, digital signal processor, signal processor, programmable logic chip, ASIC (application-specific integrated circuit), data storage element, and electronic sub-assembly.

* * * * *